METHOD OF OBTAINING TYPE CONVERSION IN CdS

Filed May 13, 1969

INVENTOR.
James A. Marley, Jr.
BY William J. Simmons, Jr.
ATTORNEY

United States Patent Office 3,600,236
Patented Aug. 17, 1971

3,600,236

METHOD OF OBTAINING TYPE CONVERSION IN CdS

James A. Marley, Jr., Needham, Mass., assignor to Corning Glass Works, Corning, N.Y.

Filed May 13, 1969, Ser. No. 824,035
Int. Cl. H01l 7/34
U.S. Cl. 148—1.5 10 Claims

ABSTRACT OF THE DISCLOSURE

A method of making p-n junction devices by bombarding a polished crystal of cadmium sulfide with ions of an element selected from the group V–A elements. When the crystal is held at an elevated temperature during the ion bombardment step, subsequent annealing is usually not necessary. When the crystal temperature is at room temperature or below during the ion bombardment step, type conversion can be obtained only by post implantation annealing.

BACKGROUND OF THE INVENTION

Cadmium sulfide belongs to a group of semiconductors which exhibits one majority carrier type, usually electrons. Normal equilibrium impurity diffusion is very seldom useful in altering this situation, and as a consequence, a large number of materials, including cadmium sulfide, could not heretofore be considered for fabrication into p-n junction devices.

Cadmium sulfide is an n-type, high bandgap compound semiconductor. The electron excess is postulated to be the result of sulfur vacancies, which accounts for its high electrical conductivity in the "as grown" state. Elements from group V–A of the Periodic Chart, which includes the elements N, P, As, Sb and Bi, might normally be selected to impart p-type conductivity to cadmium sulfide when present in concentrations up to 1.0 mole percent. However, when these dopants are introduced under thermal equilibrium, the crystal becomes an insulator rather than a p-type semiconductor. This can be explained by the theory of self-compensation whereby a nearly equal number of oppositely charged defects, in this case sulfur vacancies, will be created for every dopant atom introduced from the previous list of p-type impurities.

In order to minimize self-compensation, the crystal must be doped under conditions which do not allow the crystalline lattice to reach high temperature equilibrium while introducing the appropriate impurity an adequate distance into the material.

SUMMARY OF THE INVENTION

It is therefore an object of this invention to provide a method of preparing p-type cadmium sulfide.

Another object of the present invention is to provide a method for converting a body of n-type cadmium sulfide to p-type material by subjecting the cadmium sulfide body to high energy dopant implantation and a suitable thermal annealing cycle to remove radiation damage and diffuse the dopant to an electrically active lattice position.

Briefly, this invention consists of a method of converting a portion of a body of normally n-type crystalline cadmium sulfide to p-type material comprising the steps of implanting ions of a dopant element selected from group V–A of the Periodic Chart into one surface of the cadmium sulfide body and annealing the body at a temperature between 400° C. and 550° C. for a period of time sufficient to reduce radiation damage caused by the ion implantation and cause the implanted ions to enter into substitutional sites in the cadmium sulfide lattice.

DETAILED DESCRIPTION

Figures 1, 2:
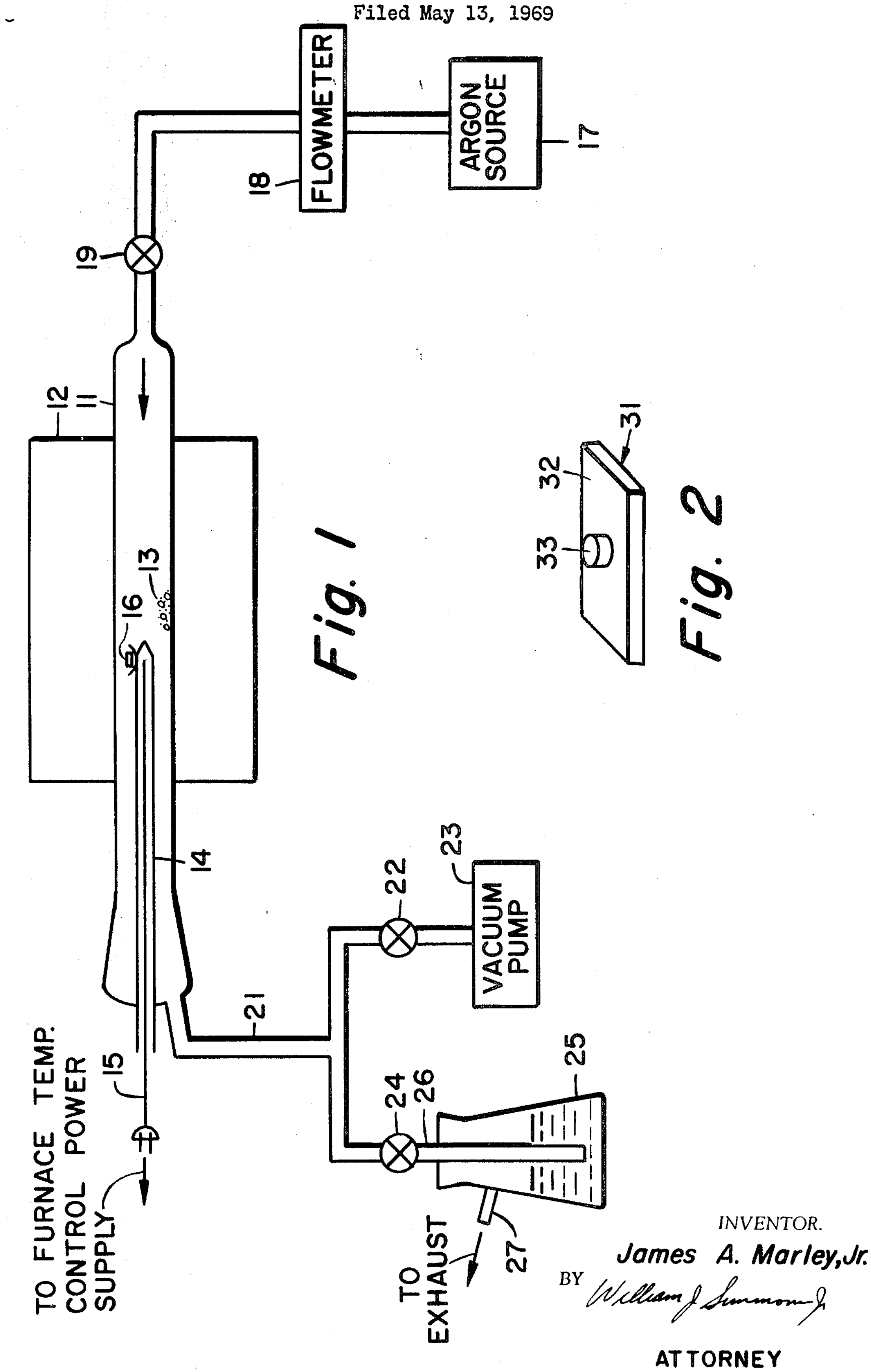
FIG. 1 is a schematic representation of apparatus which may be used for annealing CdS bodies after ion implantation.
FIG. 2 is an oblique view of a support for holding an implanted CdS body during annealing.

Apparatus for implanting ions into a sample is well known and is described in the literature and in various patents including U.S. Pat. No. 3,388,009 issued to W. J. King on June 11, 1968 and U.S. Pat. No. 3,341,150 issued to R. P. Doland, Jr. et al. on Mar. 4, 1969. Such apparatus basically consists of an ion source, an accelerator tube, a momentum analyzer and an ion deflection system. The sample is mounted on a plate which may be rotatable. The ion beam emerging from the deflection system is directed upon the sample.

Improved results were obtained when steps were taken to eliminate surface damage and contamination of the surface of the CdS body prior to implantation. Therefore, after a single crystal of CdS is cut, it is mechanically and chemically polished to produce a smooth damage-free surface. A two to three minute chemical polish using phosphoric acid at 190° C. was found to produce an optical surface with surface roughness below 500 A. Another chemical polish developed for cadmium sulfide consists of a combination of HCl, $HNO_3$, and $K_2Cr_2O_7$.

After the surface is polished, the CdS crystal is disposed on the sample holder of the ion implantation apparatus described above. Ions having energies from 10 kev. up to 2 mev. were implanted, 2 mev. being the upper limit of the equipment used. The temperature of the sample during implantation may be high enough that post implantation annealing is unnecessary, or where post implantation annealing is desired, the implantation temperature of the sample may conveniently be room temperature, although it may be below or above room temperature. In this apparatus phosphorus ions were implanted into single crystals of CdS at concentrations above the original electron concentration of the sample (typically at $10^{14}$ to $10^{15}$ ions/cm.$^2$) using beam currents of approximately 1 to 10 microamperes.

In another series of implantations, arsenic ions were implanted into crystals of cadmium sulfide at temperatures from 450° C. to 500° C. using beam currents of 0.1 to 0.5 microamperes. Post annealing was unnecessary for the devices which resulted from this hot implantation technique. Measurements of the I–V characteristics of these devices indicate that the devices resulting from this technique are similar to those obtained by ion implantation at room temperatures and below and which are subjected to post implantation annealing.

Unless the ion implantation is performed at an elevated temperature, the implanted dopant atoms do not initially substitute for the sulfur atoms; they are probably located in an interstitial site. Implantation also produces lattice damage caused by the nuclear bombardment. Proper annealing reduces the damage caused by ion bombardment and causes the dopant atoms to substitute for the sulfur atoms, thereby producing acceptor sites. If the annealing temperature is too high or if the cadmium sulfide body is subjected to a moderate annealing temperature for too long a period of time the entire crystal will be brought into thermal equilibrium thereby causing it to reconvert to the original n-type material.

FIG. 1 is a schematic representation of one type of apparatus which may be used to anneal implanted bodies of cadmium sulfide. A furnace tube 11 is located in a furnace 12 which may be of the induction heating type. A mixture 13 of small CdS crystals and sulfur powder may be spread on the wall of the furnace tube in the central part of the furnace. A body 16 of cadmium sulfide is located at the end of a support 14. The location of the body 16 is such that its temperature is slightly lower than that of the mixture 13. A lead wire 15 connects to a thermocouple which is located at the tip of the support 14 adjacent the body 16. This lead wire may be connected to the furnace temperature control power supply to precisely regulate the temperature of the body 16 during the annealing procehs. A source 17 of ultrapure inert gas such as argon is connected to the input end of the furnace tube 11 by way of a flowmeter 18 and a valve 19. The exhaust end of the furnace tube is connected to a vacuum pump by a line 21 and a valve 22. The line 21 is also connected through a valve 24 to a pipe 26 which is located in an oil filled flask 25. The upper portion of the flask 25 is exhausted through the pipe 27.

FIG. 2 is an oblique view of a support which may be provided for the implanted cadmium sulfide body during annealing. The support 31 consists of a cadmium sulfide member having a polished surface 32. The implanted surface of the cadmium sulfide body 33 is disposed adjacent the polished surface 32. This minimizes evaporation of the implanted surface during the annealing process.

With the valves 19 and 24 closed and the valve 22 opened, the system is initially pumped to a low pressure. Thereafter, the valve 19 is first opened to flush the system with pure argon gas and thereafter closed while the system is pumped again to assure that no oxygen gas remains therein. Finally, the valve 22 is sealed and the valve 19 is opened to permit pure argon gas to flow through the system at atmospheric pressure. The oil flask 25 is used at the exhaust end to prevent a backflow of air into the system. The flow rate of argon is controlled to about 60 to 130 cc./min. Then the furnace is turned on and is set to the desired annealing temperature. The warm-up time is between 15 and 20 minutes, whereas the cooling time is about 15 to 30 minutes. The temperature at the center of the furnace 12 is such that sulfur and cadmium sulfide vapor from the material 13 is carried over the cadmium sulfide body 16 by the argon gas. The purpose of this vapor is to reduce the decomposition rate of the cadmium sulfide body. Although it is preferred to anneal in an atmosphere of argon and sulfur vapor, type conversion can be obtained by annealing in pure argon.

The amount of radiation damage which exists in an implanted body depends on such factors as the implantation energy, the total dose of implanted ions, and the like. Since one of the purposes for annealing the body after ion implantation is to reduce radiation damage, annealing schedule is related to these implantation parameters, i.e., if radiation damage is extensive, the amount of annealing must be greater than that required to remove slight radiation damage. In general, samples are annealed between 400° C. and 550° C. in an inert gas atmosphere or in an atmosphere containing an inert gas and sulfur vapor as described above for a period of time sufficient to reduce radiation damage and to cause the dopant atoms to diffuse to an electrically active lattice position. When the sample is heated to 600° C. and above for a sufficient period of time the self-compensation effect will cause the type converted layer to revert to n-type material. Satisfactory p-n junctions have been formed by annealing crystals at temperatures between 425° C. and 550° C. for periods of time between 10 and 60 minutes. The junction becomes degraded when a crystal is heated at 500° C. for a period of time longer than three hours. Similarly, annealing at 625° C. for a very short period of time varies all in deterioration of the implanted surface. The junction depth is usually between a few hundred angstroms and one micron and is typically about 0.5 micron.

The tests performed on the resultant devices include thermal electric probe measurements which indicated strong hole-type current, and current-voltage characteristics which indicated strong rectification characteristics. While only single crystals of cadmium sulfide have been type converted by the method of this invention, this technique should also be applicable to polycrystalline cadmium sulfide such as films, powders, ceramics and the like. Furthermore, while only phosphorous and arsenic have been implanted in cadmium sulfide, any of the elements in group V–A of the Periodic Table should produce type conversion in this type of material.

I claim:

1. The method of converting a portion of a body of normally n-type crystalline cadmium sulfide to p-type material comprising the steps of implanting ions of a dopant element selected from group V–A of the Periodic Chart into one surface of said body and annealing said body at a temperature between 400° C. and 550° C. for a period of time sufficient to reduce radiation damage caused by said ion implantation and cause said implanted ions to enter into substitutional sites in the cadmium sulfide lattice, said period of time being insufficient to cause the p-type material so formed to reconvert back to n-type material.

2. The method of claim 1 wherein said dopant element is selected from the group consisting of phosphorous and arsenic.

3. The method of claim 1 wherein said annealing step comprises preheating said body to said temperature and maintaining said temperature during the step of implanting ions into said body.

4. The method of claim 3 wherein said annealing temperature is between 450° C. and 550° C.

5. The method of claim 1 wherein said ion implantation step is performed at a temperature which is less than said annealing temperature and said annealing step is performed subsequent to said ion implantation step.

6. The method of claim 5 wherein said period of time for which said body is annealed is between 10 and 60 minutes.

7. The method of claim 5 wherein said annealing is performed in an atmosphere including an inert gas.

8. The method of claim 7 wherein said inert gas is argon.

9. The method of claim 7 wherein said atmosphere also includes sulfur vapor.

10. The method of claim 7 wherein, prior to said annealing step, the method includes the step of placing said body on the polished surface of a cadmium sulfide member, the implanted surface of said body being adjacent said polished surface.

References Cited

UNITED STATES PATENTS

| | | | |
|---|---|---|---|
| 3,341,754 | 9/1967 | Kellett et al. | 148—1.5 |
| 3,390,019 | 6/1968 | Manchester | 148—188 |
| 3,459,603 | 8/1969 | Welsberg et al. | 148—186 |

L. DEWAYNE RUTLEDGE, Primary Examiner

R. A. LESTER, Assistant Examiner

U.S. Cl. X.R.

29—578; 148—186